(12) United States Patent
Svensson

(10) Patent No.: US 6,385,052 B2
(45) Date of Patent: May 7, 2002

(54) DRIVE UNIT FOR ELECTRIC MOTORS INCLUDING A CIRCUIT BOARD WITH POWER DISTRIBUTION BARS

(75) Inventor: Peter Klas Svensson, Tyresö (SE)

(73) Assignee: Inmotion Technologies AB, Stockholm (SE)

( * ) Notice: Subject to any disclaimer, the term of this patent is extended or adjusted under 35 U.S.C. 154(b) by 0 days.

(21) Appl. No.: 09/738,438

(22) Filed: Dec. 15, 2000

(30) Foreign Application Priority Data

Dec. 16, 1999 (SE) ................................................ 9904604

(51) Int. Cl.$^7$ ................................................ H01R 9/00
(52) U.S. Cl. ........................ 361/775; 361/776; 361/803; 174/267; 439/212
(58) Field of Search .............................. 361/775, 803, 361/778, 799, 789, 787, 776; 439/79, 876, 212, 267; 174/728, 267; 257/691

(56) References Cited

U.S. PATENT DOCUMENTS 4,834,673 A * 5/1989 Beinhaur et al. ........... 439/422
5,316,490 A * 5/1994 Clemence et al. .......... 439/113
5,655,933 A * 8/1997 Skowronski ................. 29/844

* cited by examiner

Primary Examiner—Jeffrey Gaffin
Assistant Examiner—Hung Bui
(74) Attorney, Agent, or Firm—Frishauf, Holtz, Goodman, Langer & Chick, P.C.

(57) ABSTRACT

A drive unit for power control of electric motors comprises a circuit board (10) with surface leads and a number of logic components as well as power controlling semi-conductors (11), and two or more power distribution bars (16) which extend along the circuit board (10) and are connected to a power source and/or one or more motor connections. Each of the power distribution bars (16) is a sheet metal stamping formed with a number of integral connector pins (20) which are to be received in a number of apertures (22) in the circuit board (10) and rigidly connected to the surface leads for communication with the semi-conductors (11). Each one of the power distribution bars (16) is stamped from a flexible thin sheet metal and is folded along a longitudinal line (31) into two parallel sections (32,33). The connector pins (20) extend from a first one (32) of the two sections (32,33). Each one of the connector pins (20) is substantially Z-shaped for providing an increased flexibility and for forming together with a second one (33) of the two sections (32,33) a fixing device for a ferrite ring element (28).

8 Claims, 3 Drawing Sheets

DRIVE UNIT FOR ELECTRIC MOTORS INCLUDING A CIRCUIT BOARD WITH POWER DISTRIBUTION BARS

BACKGROUND OF THE INVENTION

The invention relates to an electric drive unit for electric motors in which logic components as well as power controlling semi-conductors are carried on a circuit board with surface leads, and two or more power distribution bars are disposed across the circuit board, each having a side edge provided with a number of integrally formed connector pins which are to be received in apertures in the circuit board for communication with the semi-conductors via the surface leads on the circuit board.

One problem concerned with previously known drive units of the above type relates to thermal stresses occurring between the power distribution bars and the circuit board during operation of the drive unit. Since the drive unit is intended to deliver electric power of several hundred amperes, there is generated a considerable heat in the drive components. The differences in thermal expansion/contraction properties of the power distribution bars and the circuit board result in severe stresses in the contact points between these two members as well as within the entire structure. An important factor in this matter is that the power distribution bars have to have considerable cross sectional areas to be able to communicate high magnitude currents without too high losses, and to meet these requirements prior art power distribution bars have been formed as rather massive members with integral rigid connector pins. Accordingly, temperature related dimension changes of the power distribution bars have resulted in undesirable stresses between the circuit board and the connector pins. After many temperature changing cycles this may result in fatigue damages and impaired soldering connections between the connector pins and the circuit board leads.

Another problem concerned with prior art drive units of the above type is the difficulty to accomplish a proper soldering of the connector pins to the circuit board leads, because the large dimensions of the power distribution bars and the integral connector pins have very efficient heat conducting properties, which means that there has to be applied a considerable amount of heat to the soldering spots to accomplish a proper soldering. This means in turn that other parts and components of the drive unit are also exposed to undesirably high temperatures during the soldering process. It also means that the heating costs for the soldering process have been unnecessarily high since it requires special heating equipment.

Still another drawback of prior art drive units of the above type relates to assembly problems resulting from the arrangement of a number of ferrite rings which are mounted loosely around the connector pins and which easily falls off the connector pins during the assembly operation. This necessitates specially adapted assembly procedures and causes, despite that, frequent disturbances in the assembly operations.

OBJECT OF THE INVENTION

The main object of the invention is to accomplish a drive unit for electric motors, wherein the power distribution bars have increased flexibility so as to reduce thermal related stresses in the connector pin connections to the circuit board leads and components carried thereon, thereby facilitating assembly and increasing the service life of the drive unit.

Further objects and advantages of the invention will appear from the following specification and claims.

A preferred embodiment of the invention will be described in detail below with reference to the accompanying drawings.

DETAILED DESCRIPTION

Figure 1:
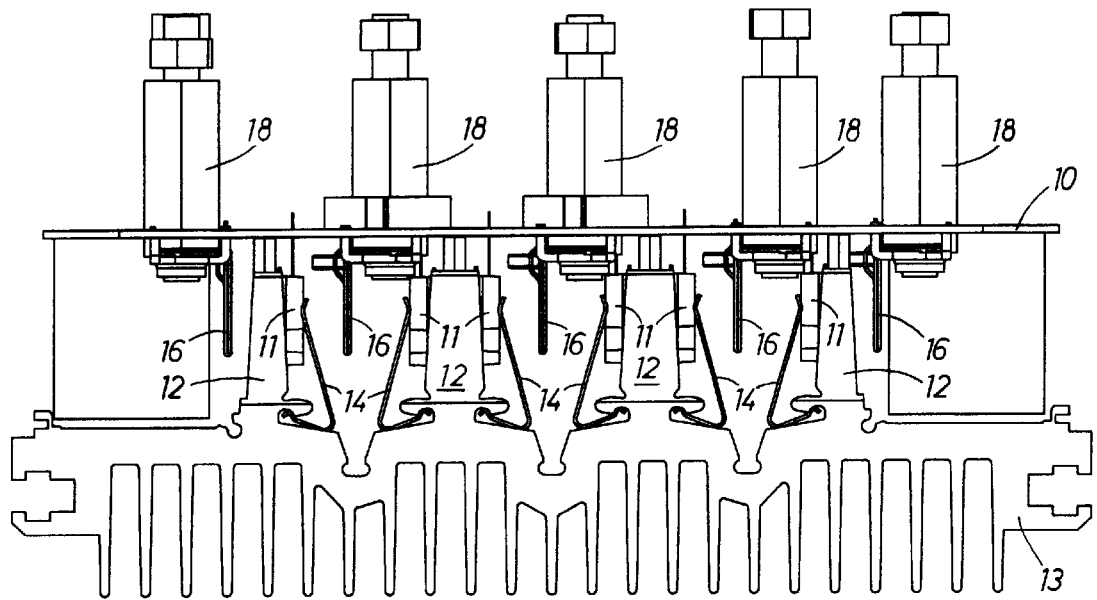
FIG. 1 shows a side view of an electric motor drive unit according to the invention including the new and improved power distribution bars.
Figure 2:
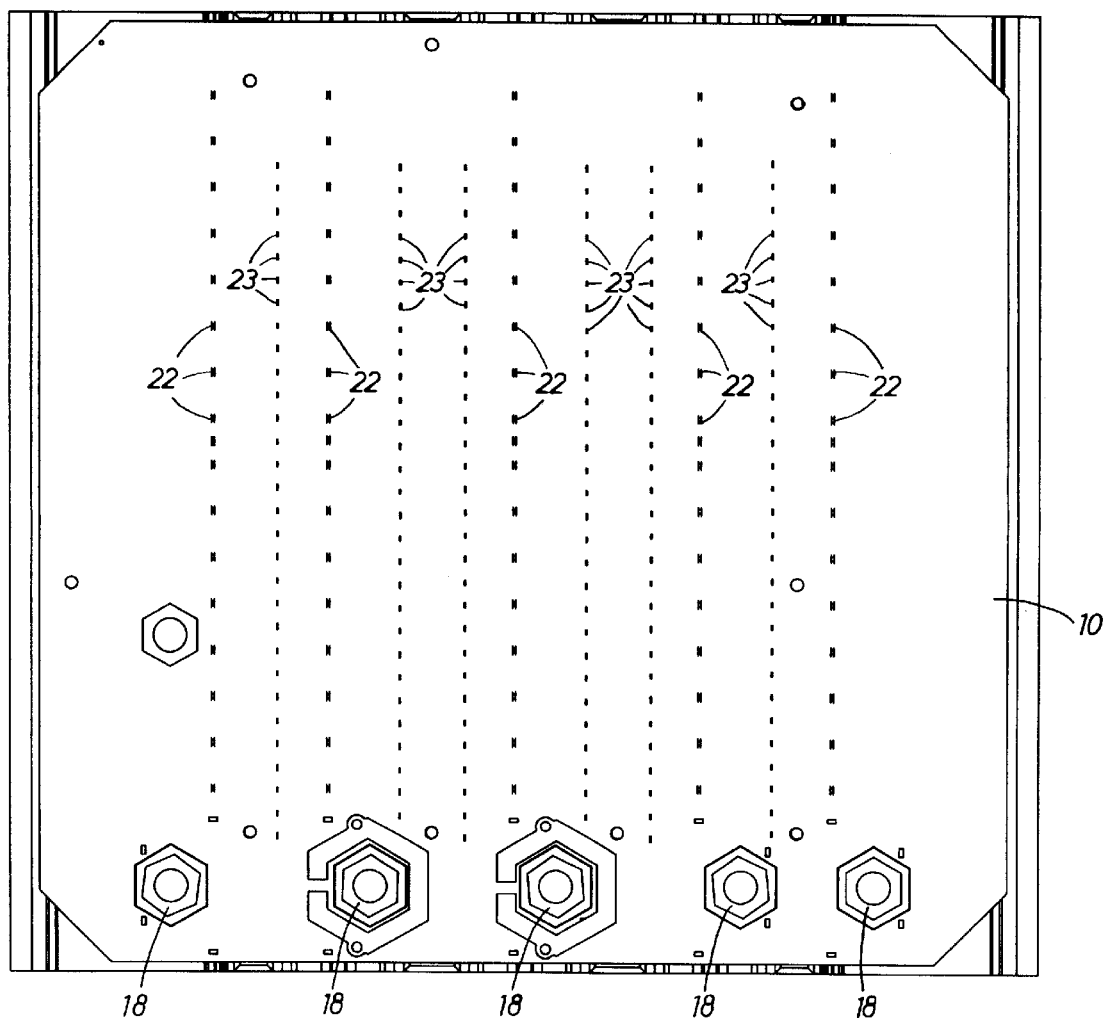
FIG. 2 shows a top view of the drive unit in FIG. 1.

The drive unit shown in FIGS. 1 and 2 is primarily intended for powering a three phase AC-motor and comprises a circuit board 10 which in a common way is formed with surface leads and a number of electric components (not shown) for forming an electric circuitry. On the underside of the circuit board 10 there are located a number of power semi-conductors 11 which connected to the surface leads on the circuit board 10 and which are clamped by means of springs 14 into a surface-to-surface contact with ribs 12 formed on a finned cooling structure 13 for transfer of heat developed in the semi-conductors 11 to the cooling structure 13.

On the underside of the circuit board 10 there are mounted five power distribution bars 16 for providing a communication with an external power source and the three phases of an AC-motor. Each power distribution bar 16 is provided with a connector bracket 17 which is secured to a cable connection pillar 18 by means of a screw joint (not shown).

Figure 6:
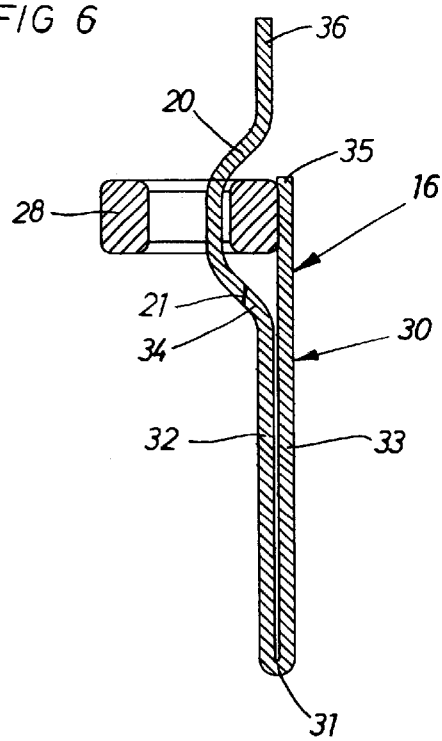
FIG. 6 shows a cross sectional view of a power distribution bar according to the invention and a ferrite element.
Figure 4:
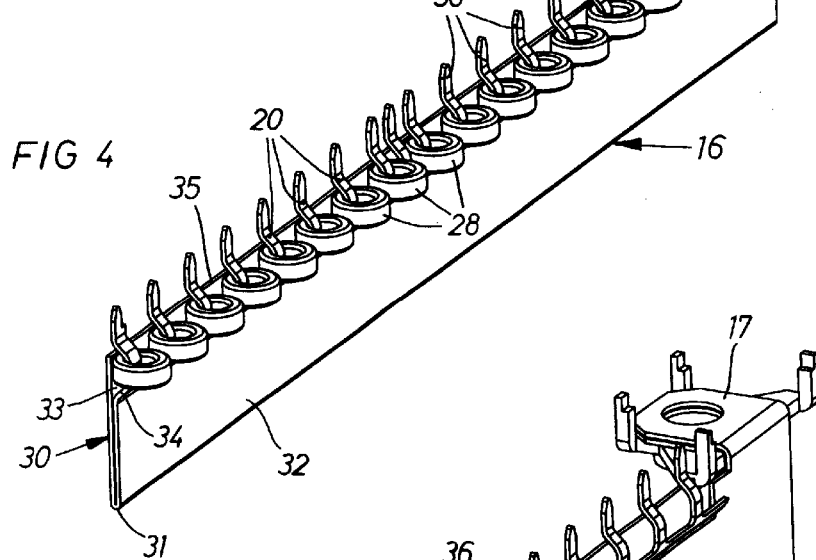
FIG. 4 shows a perspective view of a power distribution bar according to the invention.
Figure 5:
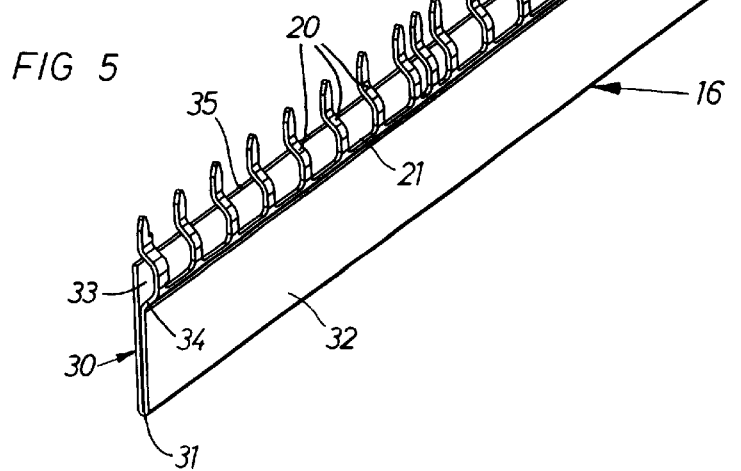
FIG. 5 shows a the power distribution bar in FIG. 4 provided with ferrite ring elements.

As shown in FIGS. 4–6, each power distribution bar 16 comprises a number of connector pins 20 which extend from one side edge 21 of the power distribution bar 16 and which are received in a row of apertures 22 in the circuit board 10. See FIG. 2. All connector pins 20 are connected to the surface leads and the components on the circuit board 10 by soldering. The circuit board 10 is also provided with rows of smaller apertures 23 for connection of electric components, like the semi-conductors 11.

Figure 3:
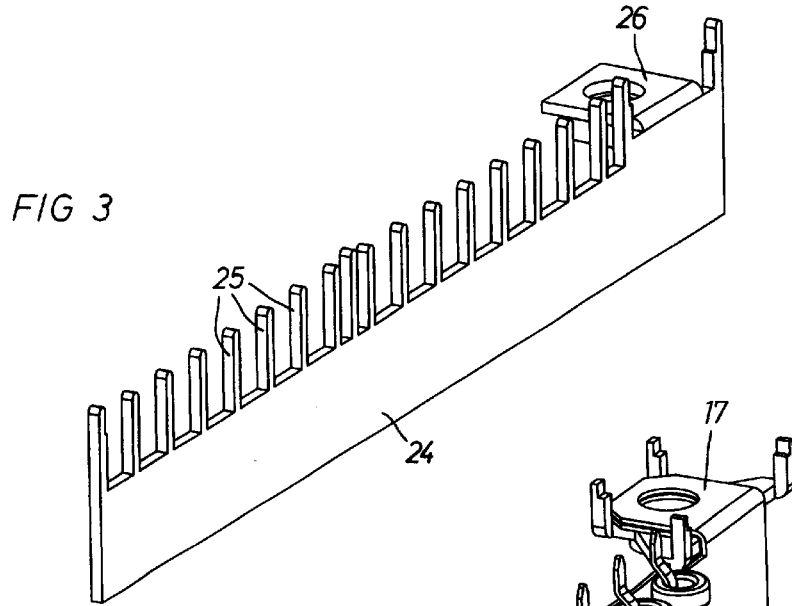
FIG. 3 shows a perspective view of a prior art power distribution bar.

Due to the high temperature during the soldering process and the differences in thermal expansion/contraction properties between the power distribution bar and the circuit board the connector pin connections are easily exposed to stresses which tend to impair and damage the soldering points. This has been a real problem up till now when power distribution bars of the type illustrated in FIG. 3 has been used. These prior art power distribution bars comprised a massive main body 24 formed integral with connector pins 25 and a connector bracket 26 as a rather thick sheet copper stamping. The connector pins 25 were straight and extended in the same plane as the main body 24. Due to its massive form, this previously used power distribution bar absorbed a lot of heat energy which meant that the soldering process required a considerable heating-up to ensure a proper soldering. This contributed to undesirably large deformations of the circuit board as well as the power distribution bar itself, and due to the stiff connector pins considerable stresses occurred in the connector pin connections on the circuit board.

For protecting the semi-conductors 11 against damaging power stresses, ferrite rings are fitted around the connector pins. A disadvantage inherent in the prior art design is the difficulty to handle the power distribution bars during the assembly process with the ferrite rings 28 maintained in their positions on the connector pins 20.

Accordingly, it is necessary to fix them thereto, and in prior art the ferrite rings have been fixed to the connector pins 25 and the power distribution bar 24 by gluing. Such a gluing process, however, is rather time consuming and costly.

As illustrated in FIGS. 4–6, the power distribution bar 16 according to the invention comprises a double folded thin walled sheet copper stamping including the connector pins 20 and the contact bracket 17. As particularly shown in FIG. 6, the power distribution bar 16 comprises a main portion 30 which consists of an originally flat sheet which is folded along a line 31 into a first section 32 and a second section 33. The first and second sections 32,33 are pressed together and extend in parallel with each other.

The first section 32 is formed with an integral flange 34 which forms an angle with the first section 32 and which comprises the side edge 21 from which the connector pins 20 extend. The first section 32 is lower than the second section 33 such that the connector pins 20 extend only partially beyond the edge 35 of the second section 33. Each one of the connector pins 20 is substantially Z-shaped and has an end portion 36 which extends in parallel with the main portion 30 and which is intended to be received in the apertures 22 in the circuit board 10.

By the Z-shape of the connector pins 20 and the edge 34 of the somewhat higher second section 33, there is formed a lock device for the ferrite rings 28. This arrangement is effective in fixing and locking the ferrite rings 28 to the connector pins 20, and it is a simple way to avoid costly auxiliary sub-processes like gluing of the ferrite rings 28 prior to connecting the power distribution bars 16 to the circuit board 10.

The process for fitting the ferrite rings 28 to the distribution bar 16 means that the two section 32,33 are initially folded towards each other leaving an angle of 10–20 degrees between them such that the ferrite rings 28 could freely be placed on the connector pins 20. Thereafter, the sections 32,33 are folded completely together, whereby the upper part of the second section 33 fixes and locks the ferrite rings 28 relative to the connector pins 20. This method is very fast and simple, and the costs for properly placing the ferrite rings 28 on the power distribution bars 16 are reduced to just a fraction of the costs for fixing the ferrite rings to the prior art power distribution bars by gluing. In a typical application, these costs have been reduced to 5% compared to the methods used at previous power distribution bars.

By forming the power distribution bars 16 as a thin walled sheet stampings, the connector pins 20 have both a flexibility to absorb thermal related deformations without causing undesirable stresses and a low mass which absorbs and leads away much less heat from the soldering points than the previously known massive power distribution bars. This means that considerably less heat has to be applied during soldering which means that the thermal related deformations of the parts involved are substantially reduced, and those deformations that still occur will be absorb to a large extent by elastic deformation of the connector pins 20.

Since each power distribution bar 16 has to cope with quite heavy currents which are transmitted to the motor, particularly during acceleration of the latter, the power distribution bars 16 according to the invention still has to have a certain mass. This is obtained by increasing the surface area of the sheet copper. In the described embodiment, this is accomplished by folding the originally flat sheet copper into the main body 30 which comprises two parallel sections 32,33. The sheet copper main body 30 could comprise three or even more sections folded from a single flat sheet copper should it be required a bigger mass in another application. The invention is not limited in that respect.

What is claimed is:

1. Drive unit for electric motors, comprising a circuit board (10) formed with surface leads and carrying a number of logic components as well as power controlling semi-conductors (11), and two or more power distribution bars (16) extending along said circuit board (10) and being connected to a power source and/or one or more electric motor connections (18), each one of said power distribution bars (16) is formed as a sheet metal stamping having a side edge (35) from which a number of integrally formed connector pins (20) extend, said connector pins (20) are arranged to be received in apertures (22) in said circuit board (10) and to be rigidly connected to said surface leads for communication with said semi-conductors (11), c h a r a c t e r i z e d in that each one of said power distribution bars (16) is formed from a flexible thin sheet metal and is folded along a longitudinal line (31) into at least two longitudinal sections (32,33), said at least one longitudinal line (31) is parallel with said side edge (35), a first one (32) of said sections is formed with said side edge (35) from which said connector pins (20) extend, and a second one (33) of said sections is located adjacent said first section (32) and is wider than said first section (32) such that said connector pins (20) extend only partially beyond said second section (33), wherein each one of said connector pins (20) is substantially Z-shaped for providing an increased flexibility.

2. Drive unit according to claim 1, wherein said first one (32) of said sections comprises a flat main portion (30) and an integral elongate flange (34), said flange (34) forms an angle with said main portion (30) and defines said side edge (35) from which said connector sins (20) extend.

3. Drive next according to claim 1, wherein a ferrite ring element (28) is carried on each one of said connector pins (20), and each connector pin (20) forms together with said second section (33) a lock device for fixing said ferrite ring element (28) relative to said connector pin (20).

4. Drive unit according to claim 1, wherein said second section (33) is entirely flat.

5. Drive unit according to claim 2, wherein a ferrite ring element (28) is carried on each one of said connector pins (20), and each connector pin (20) forms together with said second section (33) a lock device for fixing said ferrite ring element (28) relative to said connector pin (20).

6. Drive unit according to claim 2, wherein said second section (33) is entirely flat.

7. Drive unit according to claim 3, wherein said second section (33) is entirely flat.

8. Drive unit according to claim 5, wherein said second section (33) is entirely flat.

* * * * *